United States Patent

[11] 3,628,069

[72] Inventors Knut K. Najmann;
Hermann Frantz, both of Boblingen, Germany

[21] Appl. No. 820,178
[22] Filed Apr. 29, 1969
[45] Patented Dec. 14, 1971
[73] Assignee International Business Machines Corporation Armonk, N.Y.
[32] Priority Apr. 30, 1968
[33] Germany
[31] P 17 64 241.0

[54] MONOLITHIC INTEGRATED CIRCUIT HAVING INVERSELY OPERATED TRANSISTORS
3 Claims, 3 Drawing Figs.

[52] U.S. Cl. .......... 307/303, 317/235 D, 317/235 E, 317/235 X, 307/279
[51] Int. Cl. .......... H01l 19/00
[50] Field of Search .......... 317/235, 22, 22.1, 22.11; 307/303

[56] References Cited

UNITED STATES PATENTS

| | | | |
|---|---|---|---|
| 2,936,384 | 5/1960 | White | 317/235 |
| 3,244,950 | 4/1966 | Ferguson | 317/235 |
| 3,393,349 | 7/1968 | Huffman | 317/235 |
| 3,508,209 | 4/1970 | Auguste et al. | 317/235 |

*Primary Examiner*—Jerry D. Craig
*Attorneys*—Hanifin and Jancin and Theodore Galanthay ABSTRACT: A planar monolithic circuit is made with a plurality of transistors in a single isolated region in a common emitter circuit configuration. An N-type epitaxial layer constitutes the emitter region into which the base regions of a P-type material are subsequently diffused, and an N-type collector is then diffused into the base regions forming NPN transistors. The N-type epitaxial region can simultaneously be the common collector region for some of the transistors and the common emitter region for other ones of the transistor in an operative circuit arrangement. Three transistors in a single isolated region can be formed in the shape of an "L" so that when two of these are interlinked, a rectangle is formed.

INVENTORS
HERMANN FRANTZ
KNUT K. NAJMANN

BY Theodore E. Galanthay
AGENT

INTEGRATED CIRCUIT HAVING MONOLITHIC INVERSELY OPERATED TRANSISTORS

BACKGROUND OF THE INVENTION

The invention relates to a monolithic electric circuit containing a pair of transistors connected on the emitter side, preferably a storage cell with an internal bistable directly cross-coupled transistor multivibrator and an external differential amplifier controlled by the different collector potentials of the multivibrator.

Such circuits in the form of differential amplifiers, current switches or transistor flip flops are frequently used in electrical engineering. Planar technology is utilized for transistors in monolithic design. Irrespective of their circuitry, transistors are generally represented by the collector being disposed in the expitaxial layer on the substrate, the base in a succeeding diffusion and the emitter in a further diffusion layer above the base. Two transistors are normally insulated from each other by a P+—diffusion interrupting the n-epitaxy (collectors). Only in instances in which there is a common collector potential or in which the two collectors are linked through an epitaxial resistance, is such an insulation not required.

P+—insulations of this kind, forming separate isolation pockets, need much space on account of the lateral migration occurring during diffusion.

SUMMARY OF THE INVENTION

It is the object of the present invention to avoid such space losses by the use of insulating layers in the case of transistors connected on the emitter side and, furthermore, to eliminate metallizations for the galvanic links. To this end the invention provides for a pair of transistors designed according to planar technology and having the same emitter potential to be inversely operated, that means that in a common isolation pocket the emitters are represented in the n-epitaxial layer and the collectors as separate diffusions within the base diffusions.

A further feature of the invention provides for two series-connected transistors, the emitter and/or collector of which is linked with the same potential, to be designed in planar technology so that one transistor is operated in the normal manner while the other one, connected on the emitter side, is inversely operated.

Difficulties in the arrangement in accordance with the invention may occur with regard to the current amplification $\beta$ of the individual transistors. The value obtainable in conjunction with inversely operated transistors currently is $\beta\approx10$. However, when using gold doping this value drops to $\beta<1$. For many applications a current amplification of this order is adequate and a shortcoming which can be accommodated without difficulty.

An embodiment of the invention using two pairs of transistors connected on the emitter side is shown in the drawings and is hereafter described in detail.

DESCRIPTION OF THE PREFERRED EMBODIMENTS

Figure 1:
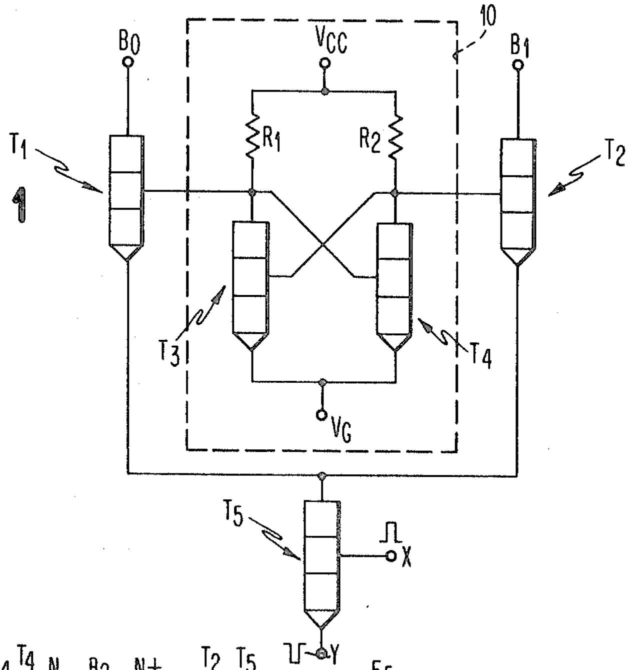
FIG. 1 shows an electric circuit of a proposed storage cell.

The description of the topological layout in accordance with the invention is preceded by a description of the operation of the storage cell of FIG. 1.

This storage cell, which has been previously suggested, consists of a storing element, namely a directly cross-coupled transistor flip flop 10. The latter comprises two transistors $T_3$ and $T_4$ with common emitter potential $V_G$. The collectors of the two transistors are linked with the operating potential $V_{cc}$ through two collector resistors $R_1$ and $R_2$ (abt. 1 kΩ). One of the two branches carries current in each instance so that two different pieces of information stored can be represented. Three further transistors $T_1$, $T_2$ and $T_5$ are used for reading and writing. For the latter two operations the cell is addressed by a positive pulse on the X-line, causing transistor $T_5$ to become conductive. Reading is performed as follows: The potential of the two emitters of the transistors $T_1$ and $T_2$ is lowered upon addressing transistor $T_5$; this results in an emitter resistance not shown in FIG. 1 and common to a plurality of storage cells being linked with the emitters of the two transistors $T_1$ and $T_2$. Through this emitter resistance the latter are connected to a negative potential voltage source, and the complete arrangement outside the flip flop 10 operates as a differential amplifier that means read current flows at $B_0$ or $B_1$, depending upon the potentials of the flip flop collectors.

Information is written into this cell by the potential on one of the terminals $B_0$ or $B_1$ being so lowered that a base current flows over the base to the collector of the transistor $T_1$ ($T_2$) which causes the base potential on the transistor $T_4$ ($T_3$) to be decreased and the latter to be blocked.

Figure 2:
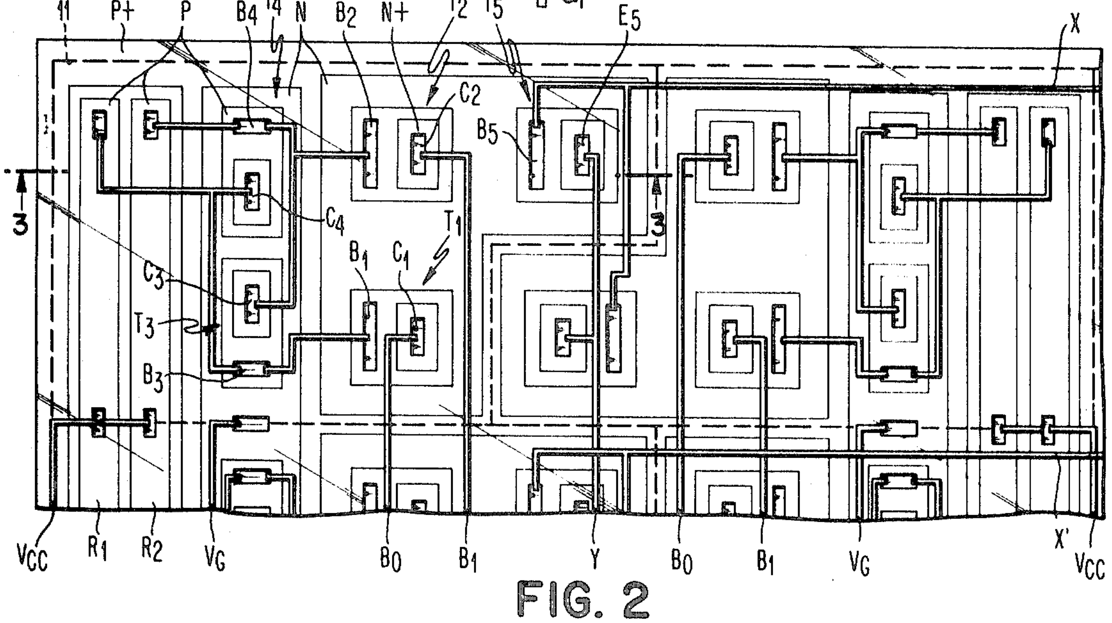
FIG. 2 shows a monolithic matrix of storage cells in accordance with an electric circuit of FIG. 1.
Figure 3:
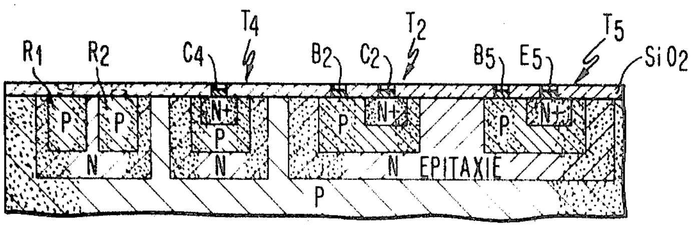
FIG. 3 shows a cross section of a part of the monolithic storage cell of FIG. 2.

A topological layout of a storage cell of the kind as described and in which in accordance with the invention the inverse operation of several transistors is utilized is shown in a matrix in FIG. 2 within the dotted line 11 and in FIG. 3. The transistors $T_3$ and $T_4$, forming the multivibrator, are inversely represented, that means the two collectors $C_3$ and $C_4$ in the base diffusions $B_3$ and $B_4$ are shown within a common emitter-n-epitaxial layer. The two collector resistances in the form of bulk resistances $R_1$ and $R_2$ are disposed in a separate isolation pocket. In a third isolation pocket there are arranged the remaining three transistors $T_1$, $T_2$, $T_5$, $T_1$ and $T_2$ of which are inversely represented so that they have one common emitter diffusion (n-epitaxy) and separate base ($B_1$, $B_2$) and/or collector diffusions ($C_1$, $C_2$). The common emitter diffusion is utilized at the same time as a collector diffusion of the transistor $T_5$ operated in a normal manner and of which are shown the base $B_5$ and the emitter $E_5$.

FIG. 3 is a sectional view of the monolithic circuit of FIG. 2. The diffusions having different conductivities are clearly discernible. On a p-substrate in n-epitaxial pockets insulated by p+—diffusions there are on the one hand the bulk resistances $R_1$, $R_2$ and on the other the inversely operated transistor $T_4$, the collector $C_4$ of which has a window for contact making, the inversely operated transistor $T_2$ with its base $B_2$ and the collector $C_2$, both of which can be contacted through an oxide window, and the transistor $T_5$ operated in a normal manner with the base $B_5$ and the emitter $E_5$ and the associated oxide windows.

We claim:

1. A planar monolithic circuit having a plurality of transistors in each of two isolated regions comprising:
   - two isolated regions;
   - at least two transistors, in the first isolated region having an epitaxial layer as a common emitter region;
   - cross-coupling conductors between said two transistors in said first isolated region, forming a bistable circuit;
   - a plurality of transistors in the second isolated region forming a control and sensing circuit for said bistable circuit at least one of said plurality of transistors in said second region having a collector region the same as an emitter region of at least another one of the said plurality of transistors in said second region; and
   - connecting means for establishing electrical contact between said bistable circuit and said control and sensing circuit.

2. A planar monolithic circuit having a plurality of transistors in each of a plurality of isolated regions comprising:
   - a first one of said plurality of isolated regions having two cross-coupled transistors in a common emitter configuration, forming a multivibrator;
   - a second one of said plurality of isolated regions having three transistors such that said epitaxial layer is the common emitter for two of the said transistors and the collector for the third of the said transistors;

at least two conductive paths for connecting the two transistors in the first one of said plurality of isolated regions with at least two of the three transistors in said second one of said plurality of isolated regions;

whereby the two transistors in said first one of said plurality of isolated regions form a multivibrator and the three transistors in said second one of said plurality of isolated regions form a differential amplifier together with an addressable gate transistor, said combination providing an operational storage cell.

3. A monolithic storage matrix in accordance with the circuit of claim 2 wherein said second one of said plurality of isolated regions is "L"-shaped and pairs of said "L"-shaped isolated regions are interlinked, forming a rectangle.

* * * * *